(12) United States Patent
Cavaleri et al.

(10) Patent No.: US 6,568,510 B2
(45) Date of Patent: May 27, 2003

(54) FLASH MEMORY INCLUDING MEANS OF CHECKING MEMORY CELL THRESHOLD VOLTAGES

(75) Inventors: Paola Cavaleri, Rousset (FR); Bruno Leconte, Rousset (FR); Sébastien Zink, Aix En Provence (FR); Jean Devin, Le Tholonet (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/997,214

(22) Filed: Nov. 15, 2001

(65) Prior Publication Data

US 2002/0119625 A1 Aug. 29, 2002

(30) Foreign Application Priority Data

Nov. 15, 2000 (FR) .............................. 00 14742

(51) Int. Cl.⁷ .............................................. G11C 16/04
(52) U.S. Cl. ........................... 185/185.12; 185/185.24; 185/185.26; 185/185.29
(58) Field of Search .................. 365/185.12, 185.24, 365/185.26, 185.29

(56) References Cited

U.S. PATENT DOCUMENTS

| | | | |
|---|---|---|---|
| 4,947,410 A | 8/1990 | Lippmann et al. | 377/26 |
| 5,239,505 A | 8/1993 | Fazio et al. | 365/185 |
| 5,598,368 A | 1/1997 | Takahashi et al. | 365/185.01 |
| 5,812,451 A * | 9/1998 | Iwata | 365/185.11 |
| 6,021,083 A | 2/2000 | Shiau et al. | 365/230.01 |
| 6,381,670 B1 * | 4/2002 | Lee et al. | 711/103 |

FOREIGN PATENT DOCUMENTS

WO 00/16338 3/2000 .......... G11C/16/10

OTHER PUBLICATIONS

Atsumi et al. "A 16–MB Flash Eeprom with a New Self–Data–Refresh Scheme for a Sector Erase Operation" IEICE Transactions on Electronics, JP Institute of Electronics Information and Comm. Eng. Tokyo, vol. E77–C, No. 5, May 1, 1994, pp. 791–798, ISSN: 0916–8524.

* cited by examiner

Primary Examiner—David Nelms
Assistant Examiner—Ly Duy Pham
(74) Attorney, Agent, or Firm—Allen, Dyer, Doppelt, Milbrath & Gilchrist, P.A.; Lisa K. Jorgenson (57) ABSTRACT

A FLASH memory erasable by page includes a flash memory array containing a plurality of floating gate transistors arranged in pages, and a checking circuit for checking the threshold voltages of the floating gate transistors. Programmed transistors that have a threshold voltage less than a given threshold are reprogrammed. The checking circuit includes a non-volatile counter formed by at least one row of floating gate transistors, a reading circuit for reading the address of a page to be checked in the counter, and an incrementing circuit for incrementing the counter after a page has been checked.

20 Claims, 6 Drawing Sheets

FLASH MEMORY INCLUDING MEANS OF CHECKING MEMORY CELL THRESHOLD VOLTAGES

FIELD OF THE INVENTION

The invention relates to electrically erasable and programmable memories, and more particularly, to a flash memory that is erasable by page.

BACKGROUND OF THE INVENTION

The market for electrically erasable and programmable integrated circuits comprises essentially EEPROM memories and FLASH (or FLASH-EEPROM) memories. EEPROM memories may be of the programmable type erasable by word or the programmable type erasable by page. Due to the current technology, FLASH (or FLASH-EEPROM) memories are usually programmable by a word and erasable by a sector. A sector usually contains a large number of pages.

Figure 1:
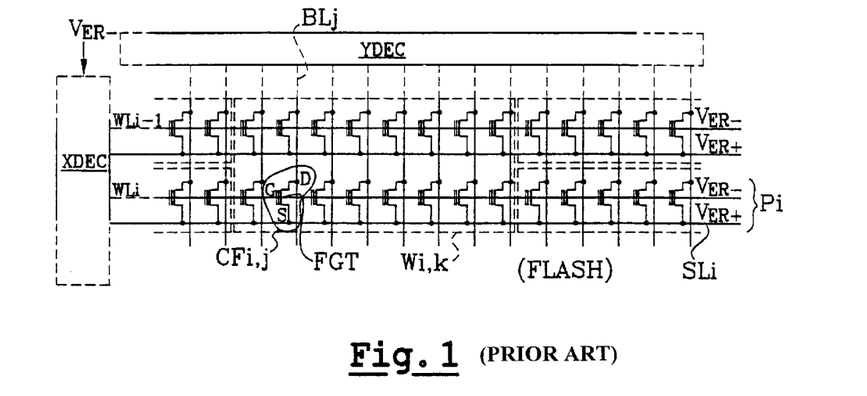
FIG. 1 diagrammatically shows a FLASH memory array according to the prior art.

FIG. 1 diagrammatically shows a FLASH memory array including a plurality of memory cells $CF_{i,j}$ laid out in matrix fashion and connected to word lines $WL_i$ and bit lines $BL_j$. The memory cells $CF_{i,j}$ in the FLASH memory have a very straightforward structure and comprise only a floating gate transistor FGT. In this case an NMOS transistor with its gate G connected to a word line $WL_i$, its drain D connected to a bit line $BL_j$ and its source S connected to a source line $SL_i$. The bit lines $BL_j$ are grouped in columns of rank k to form binary words $W_{i,k}$, for example, each including eight cells $VF_{i,j}$ (bytes). The cells in a particular word $W_{i,k}$ may be adjacent (as shown in FIG. 1) or they may be interlaced with cells belonging to other words. A physical page Pi in the FLASH memory is formed by the set of memory cells $C_{i,j}$ connected to the same word line $WL_i$, and thus comprises a plurality of binary words $W_{i,k}$. A sector is formed by a set of pages $P_i$, in which the source lines $SL_i$ are interconnected and are always at the same electrical potential.

In this type of FLASH memory, programming of a cell includes injecting electrical charges into the floating gate by a "hot electron injection" effect, while erasing a cell includes extracting electrical charges trapped in the floating gate by the tunnel effect. An erased FGT transistor has a positive threshold voltage VT1 with a low value, and a programmed transistor has a threshold voltage VT2 greater than VT1. When a read voltage $V_{READ}$ between VT1 and VT2 is applied to its gate, an erased transistor will be conducting, which by convention corresponds to reading a logical 1. A programmed transistor will remain blocked, which by convention corresponds to reading a logical 0.

Due to the simplicity of their memory cells which do not include any access transistors as in EEPROM memories, FLASH memories have the advantage of being very compact in terms of the area of occupied silicon and thus, for the same silicon area, have a significantly greater storage capacity than EEPROM memories at a lower cost. On the other hand, they are less flexible in use due to the need to simultaneously erase all memory cells in the same sector.

However, some applications benefit from the advantages of FLASH memories (compactness and low cost) while benefiting from the possibility of erasing by page, for example, when the volume of data to be recorded is small and it would be impossible to erase an entire sector before programming a page. However, there are some difficulties for a FLASH memory erasable by page.

To understand the problem that arises, it is important to first remember that a memory cell can be erased using the source erase method, or the channel erase method.

The source erase method shown in FIG. 1 includes applying a positive erasing voltage $V_{ER+}$ on the order of 4 to 5 V to all source lines $SL_i$ in the same sector, while the word lines $WL_i$ in the sector considered receive a negative erase voltage $V_{ER-}$ on the order of –8V. The material forming the transistor channel (substrate or well) is grounded. The voltage difference that exists between the source S and the gate G of the transistors has the effect of tearing off electrical charge trapped in the floating gates (by the tunnel effect) and erasing the transistors. The negative voltage $V_{ER-}$ is applied to the gates of all transistors in the same sector by inhibiting a word line decoder XDEC (FIG. 1). The voltage $V_{ER-}$ is applied to the input of this decoder, and the decoder then applies this voltage to all word lines $WL_i$ in the sector to be erased regardless of the address received at the input. At the same time, the impedance of all outputs from a column decoder YDEC connected to bit lines $BL_j$ is set to a high level.

Channel erasing is different from source erasing in that the positive erasing voltage $V_{ER+}$ is applied to the transistor sources through the material forming the channel regions (substrate or well) to which a biasing voltage VB is applied. The PN junctions that exist between the channel regions and the source regions are biased to make them conducting, and the voltage $V_B$ is applied to all transistor sources in the same sector to form the voltage $V_{ER+}$. At the same time, the negative erase voltage $V_{ER-}$, as before, is applied to the gates of transistors through the word line decoder XDEC that is in the inhibited state.

The advantage of channel erasing is that the channel regions and source regions are at approximately the same electrical potential, since channel/source junction diodes ate biased to make them conducting. Therefore, compared with source erasing, there is no more leakage current in the source/channel direction. The erase voltage $V_{ER+}$ may be increased to a higher potential than in the case of source erasing, for example, 8 to 10V compared with 4 to 5V in the first case.

One known approach for making a FLASH memory erasable by page includes providing a selection transistor for each source line $SL_i$ capable of a selectively applying the programming voltage $V_{ER+}$. This type of approach is in line with the information disclosed in patent EP 704,851 and application WO 98/33187, in which a word is selectively erased by equipping cells of a single word with a source selection transistor.

However, this approach has a number of disadvantages. First, a FLASH memory cell is programmed with a non-negligible drain-source current. Consequently, if all cells in a word are programmed simultaneously, a high current is collected by the source line selection transistor. This current increases the drain-source voltage of the selection transistor, and there is a corresponding reduction in the drain-source voltage of the floating gate transistors, and an increase in the programming time. Therefore, the cells in a same word must be programmed individually, or at the same time as cells belonging to other binary words (WO 98/33187).

Furthermore, the use of source line selection transistors is not compatible with the channel erase method. The erase voltage $V_{ER-}$ in this case is applied through the material forming the channel. Consequently, the use of source line selection transistors does not prevent the voltage $V_{ER-}$ from reaching the transistor sources and creating an electrical field causing tearing off of charge trapped in the floating gates.

SUMMARY OF THE INVENTION

In view of the foregoing background, an object of the present invention is to provide a process for selective erasure of a page in a FLASH memory sector that does not require the use of source line selection transistors.

Another object of the invention is to provide a process for selective erasure of a page in a FLASH memory sector that is compatible with the channel erase method.

Another problem that this invention is intended to solve relates to "refreshment" of the memory cells of a FLASH memory. In other words, reprogramming of cells in which the threshold voltage is modified. The provision of a FLASH memory erasable by page is only useful if the user is allowed to erase and reprogram the same page a large number of times without worrying about other memory pages. However, the memory cells of the other pages are directly connected to the bit lines $BL_i$ and are not protected by an access transistor as in the case of EEPROM memories. The memory cells will repeatedly receive on their drains the programming voltage applied to the cells of the page on which the user carries out erase and programming cycles, which will cause a gradual modification of electrical charge trapped in their floating gates, and will eventually cause data corruption.

One known approach to overcome this disadvantage is to provide a threshold voltage check for all transistors in the memory array after programming each word or after a number of word programming cycles. The check on the threshold voltage is followed by reprogramming programmed transistors for which the threshold voltage Vt is less than an authorized threshold. The disadvantage of this type of systematic checking process on the entire memory array is that it significantly slows down operation of the memory while occupying the microcontroller controlling the operation.

Thus, another purpose of this invention is to provide a process and a device in a FLASH memory for checking and reprogramming memory cells that is straightforward and efficient to use, and is transparent to the user.

These objectives are achieved by a process for recording data in a FLASH memory, including a step in which a memory page is erased and programmed, and a step in which the threshold voltage for programmed transistors is checked. Programmed transistors with a threshold voltage lower than a determined threshold may be reprogrammed, in which the checking and reprogramming step, if used, is applied to floating gate transistors for at least one page. The address of these transistors is read in a non-volatile counter formed by at least one row of floating gate transistors.

According to one embodiment, the counter is incremented by one unit after checking at least one page, by programming at least one floating gate transistor in the counter without erasing the other transistors in the counter. The transistor programmed in each new increment of the counter is the transistor following the transistor programmed in the previous increment according to a reading direction of the counter.

According to one embodiment, the counter comprises a plurality of words with increasing rank, and the address of the page to be checked is read in the counter in several steps. These steps include reading the counter word by word until finding a word containing a bit corresponding to an erased transistor, determining the high order bits of the address of the page to be checked using the rank of the first word containing a bit corresponding to an erased transistor in the counter, and determining the low order bits of the address of the page to be checked using the rank of the first bit corresponding to an erased transistor in the first word found.

According to one embodiment, the floating gate transistors encountered are laid out in a sector exclusively dedicated to the counter, such that programming voltages applied to floating gate transistors in another sector of the memory have no effect on the floating gate transistors used by the counter.

According to one embodiment, a page is checked word by word and the check of a word includes a first reading of the word by applying a first read voltage to the transistor gates corresponding to the word considered, and a second reading of the word by applying a second read voltage to the transistor gates corresponding to the word considered. The transistors are reprogrammed if the results of the two reads are not the same based upon the value of the word read when the first read voltage is applied as the reference value.

According to one embodiment, the process comprises a check of K pages after each time that a page is programmed. According to one embodiment, the process includes the check of only one page after programming K' pages.

According to one embodiment, erasing a page includes applying a positive erase voltage to the source or drain electrodes on all floating gate transistors in a memory sector including the page to be erased, applying a negative erase voltage to the gates of the transistors for the page to be erased, and applying a positive inhibit voltage to the transistor gates for at least one page that is not to be erased.

According to one embodiment, the process comprises providing voltage adaptor circuits in memory, with a page selection signal being applied to the input of these adaptor circuits. The adaptor circuits output the following data to the gates of the transistors for the corresponding page. A positive voltage is output when the selection signal is equal to a first value corresponding to non-selection of the page and the memory is in the erase mode, or when the selection signal has a second value corresponding to selection of the page and the memory is not in the erase mode, or a biasing voltage less than the positive voltage when the selection signal is equal to the second value and the memory is in the erase mode, or when the selection signal is equal to the first value and the memory is not in the erase mode.

According to one embodiment the adaptor circuits are supplied with the following: while erasing a page a biasing voltage equal to the negative erase voltage and a positive voltage equal to the inhibit voltage is supplied, and while reading a word in memory a biasing voltage equal to the ground potential and a positive voltage equal to a read voltage is supplied.

This invention is also applicable to a FLASH memory erasable by page including a memory array including a plurality of floating gate transistors connected by their gates to word lines, with all transistors connected to a particular word line forming a page in the memory array. A set of pages forms a sector in the memory array. Checking means checks the threshold voltage of the floating gate transistors. Programmed transistors with a threshold voltage below a determined threshold are reprogrammed. The check means includes a non-volatile counter formed by at least one row of floating gate transistors, means for reading the address of at least one page to be checked in the counter, and means for incrementing the counter after checking at least one page.

According to one embodiment, the means for reading the address of at least one page to be checked include means for reading the counter word by word and searching for a word containing a bit corresponding to an erased transistor, means for outputting high order bits of the address of the page to be checked starting from the rank in the counter of the first word found containing a bit corresponding to an erased transistor, and means for calculating low order bits of the address of the page to be checked starting from the rank in the first word found of the first bit corresponding to an erased transistor.

According to one embodiment, the means for incrementing the counter are arranged to program at least one floating gate transistor in the counter without erasing the other transistors in the counter. The transistor programmed in each new increment is the transistor following the transistor programmed in the previous increment in the read direction of the counter.

According to one embodiment, the floating gate transistors in the counter are laid out in a sector exclusively dedicated to the counter, such that programming voltages applied to floating gate transistors in another memory sector do not have any effect on the floating gate transistors in the counter.

According to one embodiment, the means for checking a page include means for reading a word in the page by applying a first read voltage to the transistor gates corresponding to the word considered, reading the same word on the page by applying a second read voltage to the transistor gates corresponding to the word considered, comparing the results of these two reads, reprogramming the transistors if the results of the two reads are different, and using the value of the word read by applying the first read voltage as a reference value.

According to one embodiment, the memory comprises means such that when a page is erased, a positive erase voltage is applied to the source and drain electrodes of all floating gate transistors in the sector including a page to be erased, and a word line decoder connected to word lines in memory. This includes means for applying a negative erase voltage when a page is erased to the transistor gates for the page to be erased, while applying a positive inhibit voltage to the transistor gates for at least one page that is not to be erased.

According to one embodiment, the word line decoder comprises voltage adaptor circuits into which a page selection signal is input, and the following is output to the transistor gates for the corresponding page: a positive voltage when the selection signal is equal to a first value corresponding to non-selection of the page and the memory is in the erase mode, or when the selection signal has a second value corresponding to selection of the page and the memory is not in the erase mode, or a biasing voltage less than the positive voltage when the selection signal is equal to the second value and the memory is in the erase mode, or when the selection signal is equal to the first value and the memory is not in the erase mode.

According to one embodiment, the memory comprises means for providing the following to voltage adaptor circuits: when a page is being erased a biasing voltage equal to the negative erase voltage and a positive voltage equal to the inhibit voltage is provided, and while a word is being read in memory, a biasing voltage equal to the ground potential and a positive voltage equal to a read voltage is provided.

According to one embodiment, the voltage adaptor circuit comprises an output inverter stage, into which is first input the positive voltage and second the biasing voltage, and an inverter stage driver stage including a logical EXCLUSIVE OR function into which the selection signal is input and a signal with a first value when the memory is in the erase mode and a second value when the memory is not in the erase mode.

According to one embodiment, the positive erase voltage is applied to the source or drain electrodes of the floating gate transistors through the material forming the transistor channels.

BRIEF DESCRIPTION OF THE DRAWINGS

These and other objects, characteristics and advantages in accordance with the present invention will be described in more detail in the following description of a page erase process and a process for checking memory cells, and a FLASH memory making use of these two processes, given in a non-limitative manner in relation to the appended Figures in which.

DETAILED DESCRIPTION OF THE PREFERRED EMBODIMENTS

I. Description of a Selective Page Erase Process in a FLASH Memory

Figure 2:
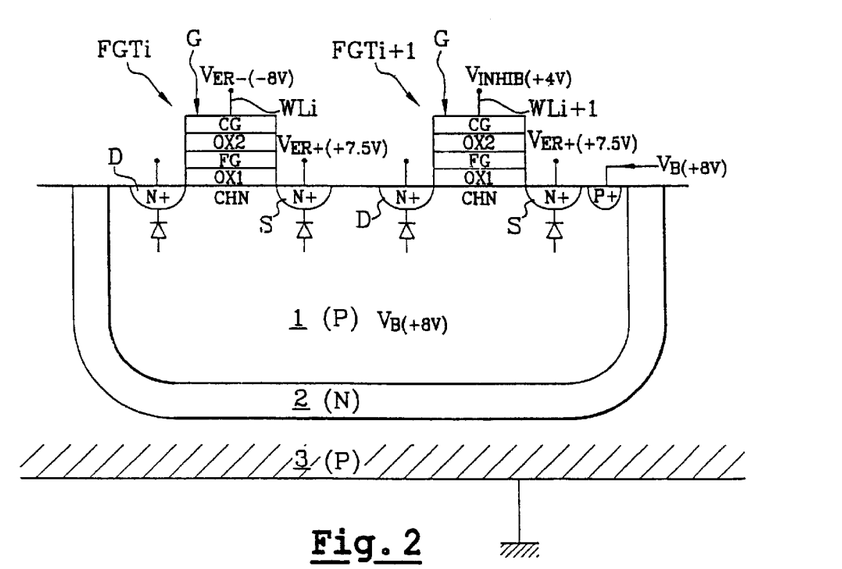
FIG. 2 is a diagrammatic sectional view of two floating gate transistors and shows the page erase process according to the invention.

FIG. 2 is a sectional view of two floating gate transistors $FGT_i$, $FGT_{i+1}$ of the NMOS type designed to be erased using the channel erase method. FGT transistors are made for this purpose using the "triple well" technique, which means that the material from which the transistor channel is made is a P-type wall 1 implanted in an N-type well 2, which itself is implanted in a P-type substrate 3. The well 1 is thus electrically isolated from the substrate 3, and its voltage may be increased to $V_B$ through a P+ type contact while the substrate 3 is grounded.

The gate G of each transistor comprises a floating gate EG deposited on the well 1 through a thin oxide layer OX1, and a control gate CG is deposited on the floating gate FG through a second oxide layer OX2. The thicknesses of the layers are not shown to scale to make the figure more easily understandable. The channel region CHN of each transistor extends under the gate oxide OX1, and is delimited by N+ type source and drain regions implanted in the shell 1.

When the transistors $FGT_i$, $FGT_{i+1}$ are erased, the well 1 is increased to a positive voltage $V_B$, for example 8 V, and an erase voltage $V_{ER+}$ on the order of 7.5 V is applied to the transistor sources S through the channel/drain junctions in the conducting direction, as diagrammatically shown by the diodes in FIG. 2. The voltage $V_{ER+}$ is also applied to the drain regions, in which the impedance is made high by a column decoder (not shown).

In the prior art, the voltage $V_{ER+}$ is applied at the same time as the negative erase voltage $V_{ER-}$ is applied to all transistor gates in the same sector, by inhibiting a word line decoder, which causes simultaneous erasing of all transistors in the same sector, where one sector comprises all transistors for which the channel is formed in the same well 1.

To achieve a selective erase by page, the concept of this invention is to apply a positive inhibit voltage $V_{INHIB}$ that compensates for all or some of the electrical field created by the voltage $V_{ER+}$ to the gate of the transistors that are not to be erased.

For example, assume that transistors $FGT_i$, $FGT_{i+1}$ have been programmed, that transistor $FGT_i$ is connected to a word line $WL_i$ that is to be erased and that transistor $FGT_{i+1}$ is connected to word line $WL_{i+1}$ +1 that is not to be erased. According to the invention, the positive inhibit voltage $V_{INHIB}$ is applied to the gate of transistor $FGT_{i+1}$, while the negative erase voltage $V_{ER-}$ is applied to the gate of transistor $FGT_i$. The voltage $V_{INHIB}$ is between 0 and 8 V and is preferably on the order of 4 V so that it can be output by a decoder powered at 4 to 5 V, as will be described later. The voltage $V_{INHIB}$ compensates for all or some of the electrical field created by the voltage $V_{ER+}$ and opposes parasitic erasing of the transistor $FGT_{i+1}$. In practice, a voltage $V_{INHIB}$ on the order of 4 V for an erase voltage $V_{ER+}$ on the order of 7.5 V eliminates all electrical stress on transistor $FGT_{i+1}$, such that repeated erase operations on transistor $FGT_i$ do not cause parasitic erasure of transistor $FGT_{i+1}$ in the long term.

Figure 3A:
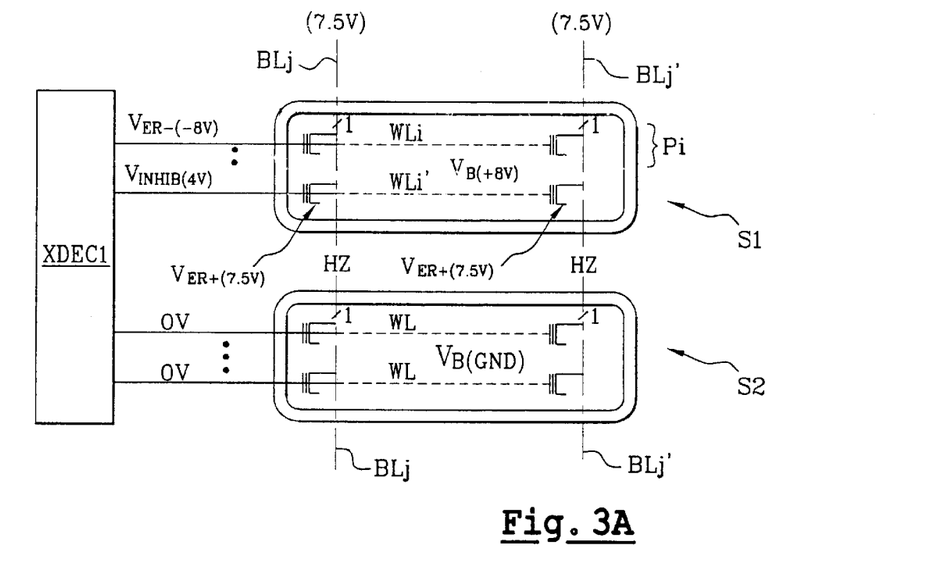
FIG. 3A diagrammatically shows the use of the page erase process in a FLASH memory according to the invention.

FIG. 3A shows the embodiment of the process according to the invention in a FLASH memory including two sectors S1 and S2, with each sector being formed by a F well implanted in an N well. The drains of the floating gate transistors in each sector are connected to bit lines $BL_j$, $BL_j'$ controlled by a column decoder (not shown), and the gates of the floating gate transistors are connected to word lines $WL_i$, $WL_i'$ controlled by a word line decoder XDEC1. The bit lines of the same rank in each sector, for example, bit line $BL_j$ in sector S1 and bit line $BL_j$ in sector S2 are isolated electrically by local decoding at the sectors, which in itself is done conventionally and is not shown in the figure.

For example, assume that page $P_i$ of sector S1 corresponding to word line $WL_i$ is to be erased without erasing the other pages in the sector S1 or in S2. The voltage $V_B$ of the well in sector S1 is increased to several volts, for example, 8 V as described above, such that the positive erase voltage $V_{ER+}$ is applied to all transistor sources in sector S1. According to the invention, the decoder XDEC1 outputs the negative erase voltage $V_{ER-}$ on the word line to be erased $WL_i$, and outputs the inhibit voltage $V_{INHIB}$ on all other word lines $WL_i'$ in sector S1. Thus, only transistors on page $P_i$ are erased and the electrical stress applied to the transistors in the other pages in sector S1 is negligible, as has already been explained.

At the same time, in sector S2, the impedance of all bit lines $BL_j$, $BL_j'$ is made high (isolation is obtained by local decoding as mentioned above), a zero voltage (GND) is applied to all word lines WL and the well in sector S2 is connected to ground (GND). Therefore, the transistors in sector S2 are fully isolated from the erase voltages that are applied in sector S1.

Obviously, the process according to the invention can be applied to simultaneous erasure of several pages of a sector while preventing erasure of one or several other pages in the same sector. However, in the following, it is assumed that one erase cycle includes erasing only one page without erasing the other pages in the sector, which corresponds to the embodiment usually applied in practice.

Figure 3B:
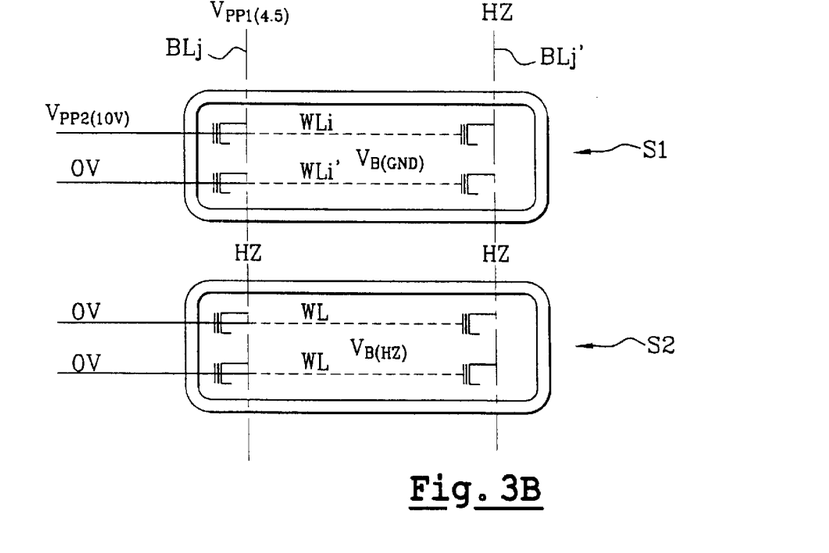
FIG. 3B diagrammatically shows programming of a word in a FLASH memory according to the invention.

In a FLASH memory according to the invention, the process for programming a word after a page has been erased is applied in accordance with prior practice as shown in FIG. 3B. A word is programmed by applying a voltage $V_{PP1}$ equal to 4 to 6 V to the drain of the transistors to be programmed through corresponding bit lines $BL_j$, and by applying a programming voltage $V_{PP2}$ on the order of 10 to 12 V to the transistor gates through the corresponding word line $WL_i$. The well corresponding to the sector considered is set to ground potential ($V_B$=GND). Transistors to which voltages $V_{PP1}$ and $V_{PP2}$ are applied are in the conducting state and are strongly biased during the operation.

Since the programming current is not negligible, only a small number of transistors, usually eight, are programmed at any one time, namely one byte with all its bits equal to 0. The impedance of bit lines $BL_j'$ that do not correspond to the word to be programmed are made high (HZ), and the word lines WL that do not correspond to the page on which the word to be programmed is located are held at 0 V (GND). In the adjacent sector S2, the impedance of all bit lines is made high (HZ) and all word lines are held at 0 V.

II. Aspects of the Invention Relating to Word Line Decoders

Implementation of the process according to the invention requires the use of a word line decoder XDEC1 capable of selectively outputting the negative voltage $V_{ER-}$ at word line $WL_i$ corresponding to the page $P_i$ to be erased, while applying voltage $V_{INHIB}$ to other word lines $WL_i'$ in the sector considered.

However, conventional word line decoders cannot be used for selective application of the negative voltage $V_{ER-}$ to a word line designated by a given address since the voltage $V_{ER-}$ is applied to all word lines in the sector to be erased.

A. Reminders About Conventional Word Line Decoders with Negative Voltage

Figure 4:
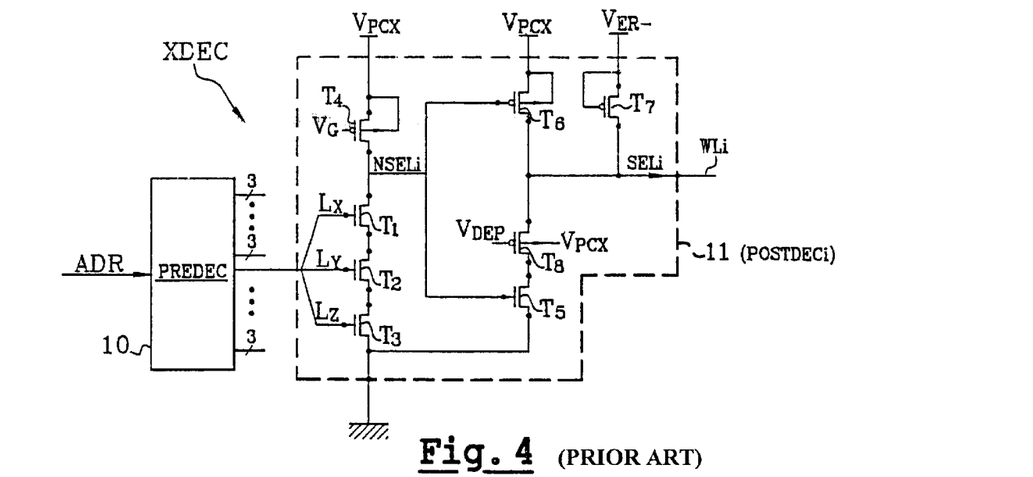
FIG. 4 shows a conventional word line decoder according to the prior art.

FIG. 4 shows a conventional word line decoder XDEC including a pre-decoder 10 (PREDEC) and a plurality of post-decoders 11 (POSTDEC$_i$), with only one post-decoder 11 with rank i being shown. A page selection address ADR is applied to the input of pre-decoder 10 and this pre-decoder has a plurality of outputs, with one output for each word line to be controlled. The pre-decoder outputs selection signals Lx, Ly, Lz on each of its outputs, and these selection signals are applied to a post-decoder 11 with rank i. The post-decoder 11 outputs a selection signal $SEL_i$ applied to the word line $WL_i$ with the corresponding rank.

Each post-decoder 11 has a NAND gate at its input including three NMOS transistors in series T1, T2, T3 forming the pull-down part of the WAND gate. The pull-up part of the NAND gate, which pulls the output node up to a positive voltage $V_{PCX}$, is formed by a PMOS transistor 24 controlled by a voltage VG. The gates of transistors T1, T2, T3 are controlled by the Lx, Ly, Lz signals respectively. Depending on the value of these signals, the NAND gate outputs a signal $NSEL_i$ equal to 1 ($V_{PCX}$) or 0 (GND). The signal $NSEL_i$ is applied to an inverter gate biased by voltage $V_{PCX}$, including an NMOS transistor T5 and a PMOS transistor T6. The output node of the inverter gate outputs a selection signal $SEL_i$ that may be equal to $VPC_X$ (logical 1) or 0 V (logical 0).

The voltage $V_{PCX}$ is equal to the voltage $V_{READ}$ in the read mode, and is equal to the programming voltage $V_{PP2}$ in the programming mode. In the erase mode, the negative voltage $V_{ER-}$ is output by a PMOS transistor T7 laid out as a diode, the drain of which receives the voltage $V_{ER-}$, and the source of which is connected to the output from the inverter gate T5/T6. To prevent a current leak to ground through transistor T5, a PMOS isolating transistor T8, controlled by a negative voltage $V_{DEP}$, is placed between the output node from the inverter gate T5/T6 and the drain of transistor T5.

When the negative erase voltage $V_{ER-}$ is applied to the post-decoder 11, the inverter gate T5/T6 is kept in the high impedance state (transistor T4 is conducting) and the post-decoder is inhibited. Thus, all post-decoders 11 in the XDEC decoder output the negative voltage $V_{ER-}$, which causes erasure of all pages of a sector.

B. Example Word Line Decoder According to the Invention

Figure 5:
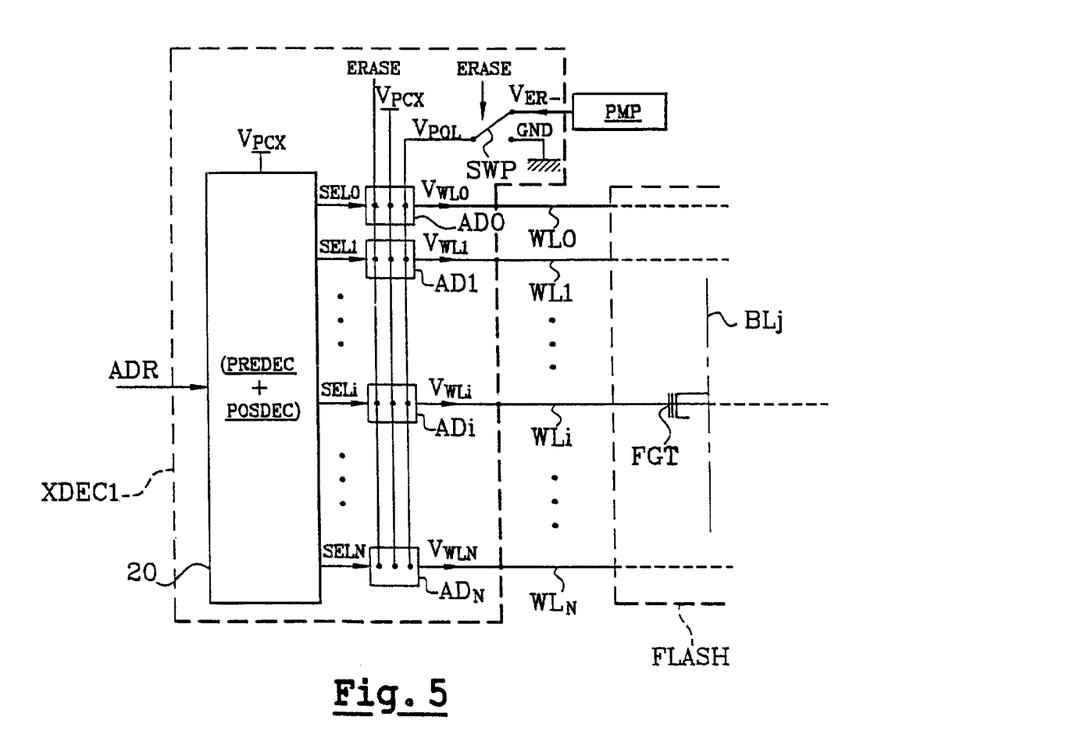
FIG. 5 shows a word line decoder according to the invention.

FIG. 5 shows a word line decoder XDEC1 according to the invention capable of selectively outputting a negative erase voltage $V_{ER-}$ on a word line $WL_i$ denoted by an address ADR, while outputting an inhibit voltage $V_{INHIB}$ on the other word lines in a sector. Note that the decoder XDEC1 shown is designed to control word lines in the same sector. This decoder architecture thus needs to be duplicated several times in a memory that contains several sectors to inhibit XDEC1 decoders attached to sectors that are not concerned by a programming or erasing operation taking place in another sector.

The decoder XDEC1 comprises a conventional decoding stage 20 including the predecoder PREDEC described above, and a plurality of post-decoders POSTDEC each outputting a page selection signal $SEL_0$, $SEL_1$ . . . $SEL_i$, . . . $SEL_N$ that depends on the ADR address received at the input. In this case, post-decoders are of the positive voltage type and correspond to the post-decoder 11 shown in FIG. 4 in which transistors T7 and T8 are deleted. The decoding stage 20 is powered by the voltage $V_{PCX}$, and consequently the output selection signals $SEL_i$ are equal to $V_{PCX}$ or 0 V.

According to the invention, the decoder XDEC1 comprises a plurality of voltage adaptor circuits $AD_0$, $AD_1$, . . . $AD_i$, . . . $AD_D$, a selection signal $SEL_0$, . . . $SEL_1$, . . . $SEL_i$, . . . $SEL_N$ is applied to the input of each circuit, and each circuit outputs voltages $V_{WL0}$, $V_{WL1}$, . . . $V_{WLi}$, $V_{WLN}$ to word lines $WL_0$, $WL_1$, . . . $WL_i$, . . . $WL_N$ in the FLASH memory array. The voltages may be positive, negative or zero depending on the operation being carried out, and the value of the signal $SEL_i$ received at its input. Each adaptor circuit $AD_i$ receives an ERASE signal on another input, which may, for example, be equal to 1 in a page erase mode, and is powered by voltage $V_{PCX}$ and voltage $V_{POL}$.

The voltage $V_{PCX}$ is equal to the voltage $V_{READ}$ in the read mode, the programming voltage $V_{PP2}$ in the programming mode, and the inhibit voltage $V_{INHIB}$ in the erase mode. Moreover, the voltage $V_{POL}$ is equal to the negative erase voltage $V_{ER-}$ in the erase mode, and is equal to 0 V in other memory operating modes. For example, the voltage $V_{POL}$ may be output by a switch SWP with two inputs controlled by the ERASE signal. The voltage $V_{ER-}$ output by a charge pump PMP is applied to an input to switch SWP while the other input to the switch is connected to ground. When the ERASE signal is equal to 1, switch SWP outputs voltage $V_{ER-}$. When the ERASE signal is equal to 0, switch SWP connects the voltage distribution line $V_{POL}$ to ground (GND).

The transfer function for each voltage adaptor circuit $AD_i$ is described in Table 1 below (the COM and NCOM signals are intermediate signals described later). In erase mode (ERASE=1), the voltage $V_{WLi}$ applied to a word line $WL_i$ is equal to $V_{ER-}$ if the word line is selected ($SEL_i$=1), or is equal to $V_{INHIB}$ if the word line is not selected ($SEL_i$=0). Outside erase periods (ERASE=0), the voltage $V_{WLi}$ applied to a selected word line $WL_i$ ($SEL_i$=1) is equal to the voltage $V_{PCX}$ that can be used as a read voltage $V_{READ}$ or as an erase voltage $V_{PP2}$ according to the operation currently being carried out, while the voltage $V_{WLi}$ applied to an unselected word line $WL_i$ ($SEL_i$=0) is zero.

TABLE 1

| ERASE | $SEL_i$ | COM | NCOM | $VWL_i$ |
|---|---|---|---|---|
| 0 | 0 | 0 | 1 | $VWL_i = V_{POL} = GND$ |
| 0 | 1 | 1 | 0 | $V_{WLi} = V_{PCX} = V_{READ}$ (4, 5 V) or $V_{PP2}$ (8–10 V) |
| 1 | 0 | 1 | 0 | $V_{WLi} = V_{PCX} = V_{INHIB}$ (4 V) |
| 1 | 1 | 0 | 1 | $V_{WLi} = V_{POL} = V_{ER-}$ (−8 V) |

Figure 6:
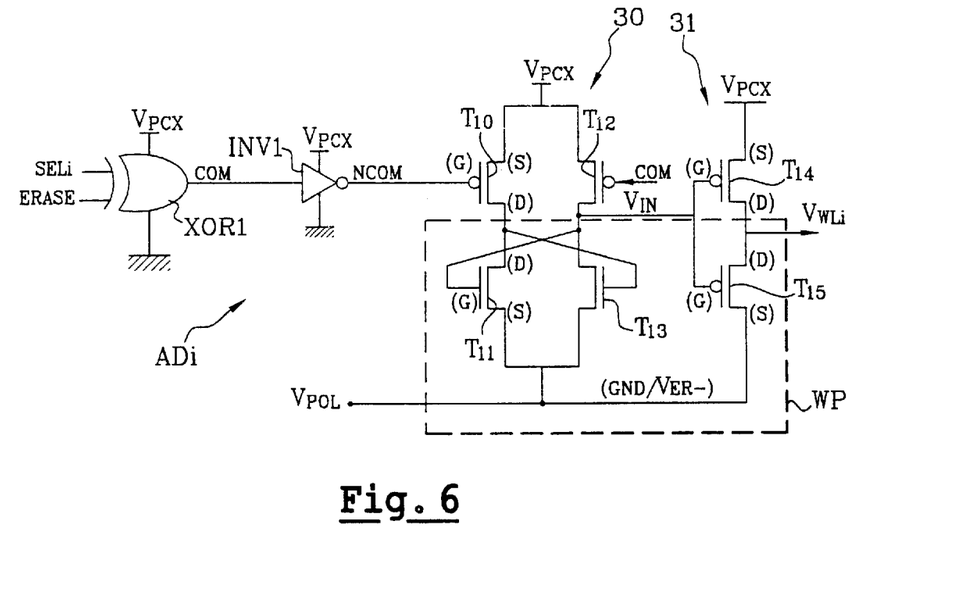
FIG. 6 is an electrical diagram of a voltage adaptor circuit shown in block form in FIG. 5.

FIG. 6 shows an embodiment of a circuit $AD_i$ according to the invention. The circuit $AD_i$ comprises an EXCLUSIVE OR type of gate XOR1 into which the $SEL_i$ and ERASE signals are input, and outputs a COM signal. The COM signal is applied to an inverter gate INV1 that outputs an NCOM signal. The gate XOR1 and the gate INV1 are powered by voltage $V_{PCX}$, such that the value of the COM and NCOM signals is equal to the voltage $V_{PCX}$ when they are equal to 1. The COM and NCOM signals are applied to a driver stage 30, the output of which controls an inverter stage 31.

The driver stage 30 comprises two parallel branches each including a PMOS transistor T10 and T12 respectively, in series with an NMOS transistor T11 and T13. The drains of transistors T10, T12 are brought to voltage $V_{PCX}$, while voltage $V_{POL}$ which may be equal to the potential of ground GND or the negative voltage $V_{ER-}$ as was described above is applied to the sources of transistors T11, T13. The mid-point of branch T12/T13 is connected to the gate of transistor T11, and the mid-point of branch T10/T11 is connected to the gate of transistor T13.

The inverter stage 31 comprises a PMOS transistor T14 in series with NMOS transistor T15. The voltage $V_{PCX}$ is applied to the source of transistor T14, and the voltage $V_{POL}$ is applied to the source of transistor T15. The transistor gates are driven by the mid-point of branch T12/T13, and the mid-point of the inverter stage T14/T15 outputs the voltage $V_{WLi}$. The NMOS transistors T11, T13 and T13 and T15 are made in a well WP of the P-type isolated from the substrate by an N-type well according to the triple well technique described above.

The operation of the adaptor circuit $AD_i$ is described in Table 1 above. The driver stage 30, to which the voltage $V_{POL}$ is applied as a pull-down voltage, is used to apply a blocking voltage equal to $V_{ER-}$ to the gate of transistor T15 in the inverter stage 31 when the drain of transistor T15 is set equal to the voltage $V_{ER-}$ ($V_{POL}=V_{ER-}$), or to a blocking voltage equal to 0 when the drain of transistor T15 is connected to ground ($V_{POL}$=GND).

III. Production of a FLASH Memory Erasable by Page, Including Means of Refreshing the Memory Cells A. Checking the Threshold Voltage of Floating Gate Transistors As mentioned above, a FLASH memory that is programmable by page with a large storage capacity must preferably comprise means of checking and refreshing (reprogramming) its memory cells if the user is to be allowed the possibility of carrying out a large number of erase/programming cycles on the same page.

Thus, if the user is allowed the possibility of reprogramming the same page Z times in a memory sector with a capacity of X1*Y1 bytes, where X1 is the number of word lines (or pages) and Y1 is the number of columns, the maximum stress time DST supported by floating gate transistors for a page is equal to:

DST1=(X1−1)Z Tp and corresponds to the case in which each of the X1−1 other pages in the sector is programmed Z times. Tp is the programming time for a floating gate transistor, during which the programming voltage $V_{PP1}$ will be applied to transistors belonging to pages other than the page currently being programmed but connected to the same bit line $BL_j$. For a 512 kbit memory sector including 256 word lines and 256 columns with 8 bits each (namely 256 words or 2048 bits per page), and for an allowable number Z of reprogrammings equal to $10^5$ and a programming time Tp equal to 5 µs, the maximum stress time that a transistor can resist is on the order of 128 seconds, which is a very high electrical stress.

The purpose of the invention is thus to reduce this maximum stress time DST but without making a systematic check on the threshold voltages of all floating gate transistors in the sector every time that a page is programmed.

B. Proposed Solution

Consequently, a first idea of this invention is to check floating gate transistors in K memory pages after each page programming cycle, where K is equal to 1 in a preferred embodiment of the process according to the invention. The K pages checked after each programming cycle must be different from the K pages checked in the previous programming cycle, so that all memory pages are checked gradually.

Another concept of the invention is to manage the addresses of pages to be checked using a non-volatile counter incremented by one unit after each check on a page. The counter is made using floating gate transistors in the FLASH memory array. In this way, it will be possible to cyclically check all pages in the memory returning to the first page by resetting the counter to zero when it has reached the last memory address.

In a memory with several sectors, a counter may be provided for each sector or for all sectors. If a counter is provided for each memory sector, the maximum stress time is corrected to the following value, where X1 is the number of pages in each sector:

$$DST2=(X1-1)Tp/K<<Z$$

since a transistor will be checked every (X1−1)/K programming cycle, where K is preferably equal to 1.

However, if only one counter is provided for all sectors of the memory, the maximum stress time is equal to the following value:

$$DST3=(X2-1)Tp/K<<Z$$

where X2 is the total number of pages in the memory, and all sectors are combined.

Note that the above relations ignore the electrical stress due to reprogramming of the transistors with modified threshold voltages. This additional stress is negligible in practice, since statistics show that one transistor out of a thousand must be reprogrammed after having been checked.

C. Stresses Related to Providing a Counter

There is the same problem with providing a counter as with the life of floating gate transistors in the counter itself. As mentioned above, floating gate transistors may be erased and reprogrammed Z times, such as a hundred thousand times in the example above. However, if the counter is erased and reprogrammed with a new value incremented after each page programming cycle, the number of erase or reprogramming cycles of transistors in the counter will be equal to X1*Z or X2Z depending on whether the counter is assigned to a sector or to an entire memory. This number will significantly exceed the allowed number Z.

To solve this problem, this invention proposes a method of incrementing the counter that includes programming a transistor for each increment without erasing or reprogramming the other transistors except when the counter has to be reset to zero. Thus, counting is then done using the tokens method, and a token that has been used cannot be reused. The address of the page to be checked is determined by the rank of the next token to be used, namely the rank of the first unprogrammed transistor encountered along the read direction of the counter. When all tokens have been used, the counter is erased and counting starts again from the first token.

Another constraint related to prediction for such a counter is related to the electrical stress that transistors in the counter may have to resist due to memory page programming cycles. This invention proposes to overcome this disadvantage by arranging the counter in a sector independent of the other memory sectors, such that floating gate transistors in the counter will not be affected by the programming voltages applied to bit lines in other sectors.

Obviously, the process according to the invention may be used in different alternatives. In a memory with a small number of pages (small X1 or X2), the checking process according to the invention may be restricted to checking a page (where K is equal to 1) every K' page programming cycle. In this case, the stress time DST2 or DST3 mentioned above must be multiplied by K'.

D. Example Embodiment of a Memory According to the Invention

Figure 8:
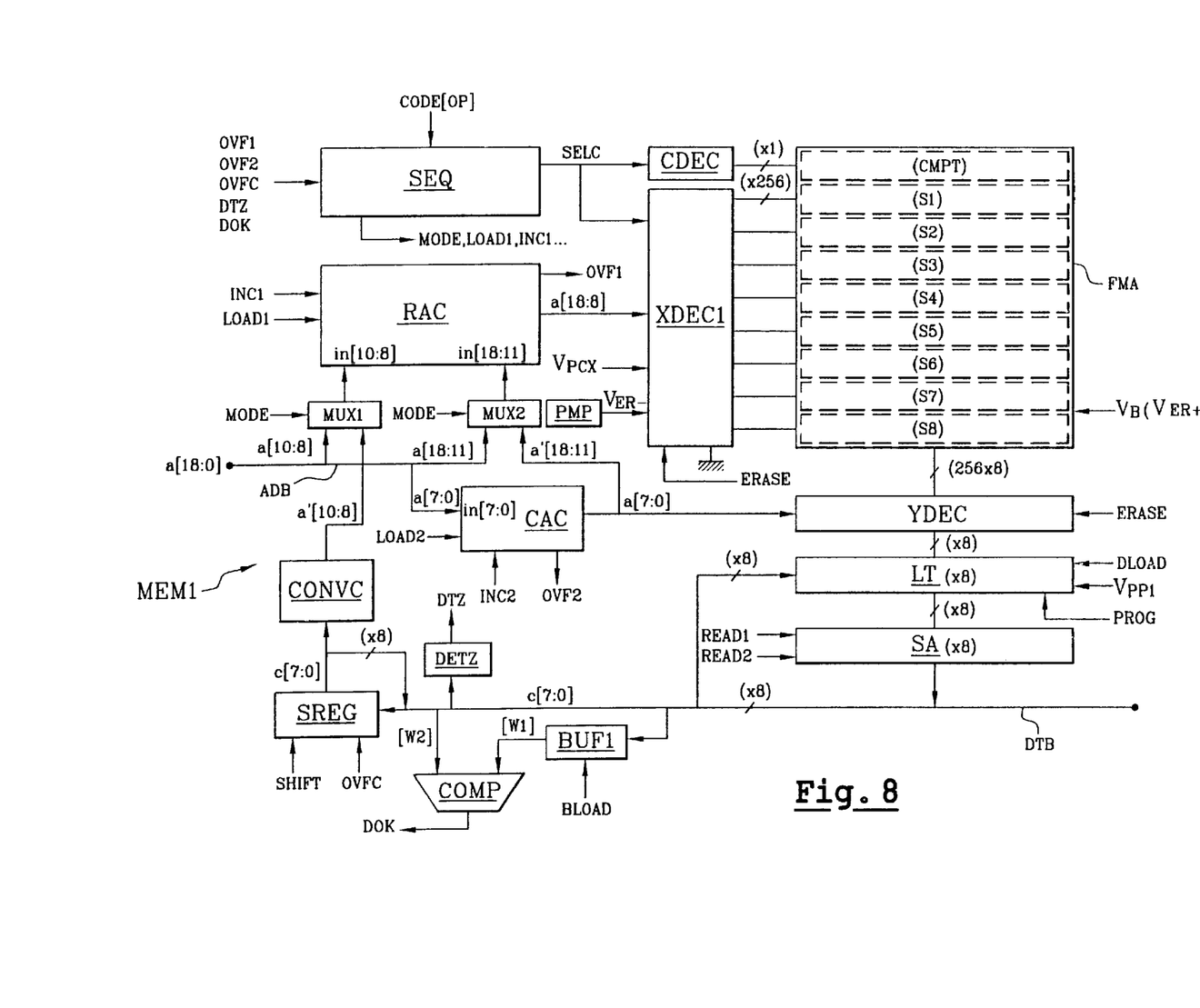
FIG. 8 shows a FLASH memory including means of implementing the erase process and the checking process according to the invention.

FIG. 8 shows a memory 1 MEM1 in the form of blocks making use of the process for checking and reprogramming memory cells according to the invention. The memory MEM1 comprises a flash memory array FMA including eight data sectors S1 to S8, and a sector forming a counter CMPT according to the invention. Each of the sectors is isolated from the others using the triple well technique and contains 256 word lines $WL_i$ or pages each containing 256 8-bit words (bytes), making 2048 bit lines $BL_j$. The memory thus includes a total of 2048 pages distributed in the eight sectors and has a storage capacity of 4 Mbits.

In this case the CMPT counter only includes one word line and is dedicated to checking the pages in the eight sectors. The CMPT counter contains 2048 bits, such that a counter bit may be assigned to the designation of a page using the tokens method described above.

Furthermore, the memory is provided with a word line decoder XDEC1 according to the invention, capable of applying the erase voltage $V_{ER-}$ or the inhibit voltage $V_{INHIB}$ to a word line $WL_i$. The CMPT counter is addressed by a specific decoder CDEC activated by a signal SELC that automatically inhibits the decoder XDEC1. The memory MEM1 also comprises a column decoder YDEC, a programming register LT, a read circuit SA, a row address counter RAC and a column address counter CAC.

The column decoder YDEC contains 2048 inputs/outputs connected to the 2048 bit lines in the flash memory array FMA, and eight inputs/outputs connected to the programming register LT and to the read circuit SA.

The register LT conventionally comprises eight high voltage latches (not shown) for programming a byte in the memory array. The output of the latches is connected to the eight inputs/outputs of the column decoder YDEC, and the input is connected to an 8-bit data bus DTB. The register LT records a byte present on the bus DTB on reception of a signal DLOAD, and outputs the programming voltage $V_{PP1}$ on its outputs (depending on the values of the bits of the loaded byte) on reception of a programming signal PROG.

The read circuit SA, activated by a READ signal, conventionally comprises eight sense amplifiers (not shown)

connected to the eight inputs/outputs of the column decoder YDEC, and its output is connected to the data bus DTB.

Eleven high order address bits a[18:8] present on an address bus ADB are applied to the input of the row address counter RAC, and the row address counter outputs these address bits to the column decoder XDEC1. The RAC counter is controlled by a load address bits signal LOAD1 and may be incremented by a signal INC1. It outputs a signal OVF1 if there is an overflow after the increment. The high order address bits a[18:8] are applied to the RAC counter by passing through two multiplexers MUX1 and MUX2 with two inputs each. More particularly, three address bits a[10:8] are applied to the RAC counter on inputs in[10:8] through multiplexer MUX1, one input of which is connected to the bus ADB, and eight address bits a[18:11] are applied to inputs in[18:11] through multiplexer MUX2, one input of which is also connected to the bus ADB. Multiplexers MUX1 and MUX2 are controlled by the MODE signal described later.

The column address counter CAC receives eight low order address bits a[7:0] on inputs in[7:0] connected to the ADB bus. The output from the CAC counter outputs address bits a[7:0] to the address input of the column decoder YDEC, and is also connected to the second input of the multiplexer MUX2. The CAC counter is controlled by a load signal LOAD2, by an increment signal INC2 and when applicable, outputs an overflow signal OVF2.

The memory MEM1 also comprises a shift register SREG with a parallel input/output, a circuit CONV, a zero detector DETZ, a buffer BUF1, a logical comparator COMP and a sequencer SEQ.

The input of the register SREG is connected to the data bus DTB and its output is connected to the input of a conversion circuit CONVC and to the data bus DTB. The register SREG is controlled by a shift signal SHIFT and outputs an overflow signal OVFC when its contents reach the value $00_H$ after a shift to the right. The circuit CONVC is a wired logic circuit that performs a decoding function described later. Its output is connected to the second input of the multiplexer MUX1.

The input of detector DETZ is connected to the data bus DTB, and it outputs a signal DTZ equal to 1 when a byte equal to $00_H$ is present on the bus DTB. The input of the buffer BUF1 is connected to the bus DTB and its output is applied to an input of the comparator COMP, the other input of which is connected to the bus DTB. The buffer BUF1 loads data when it receives a load signal BLOAD, and the comparator COMP outputs a data OK signal DOK when a word W2 is present in the data bus DTB and identical to a word W1 present on the output from buffer BUF1.

Finally, the sequencer SEQ with wired logic or based on a microprocessor, such as a microcontroller, outputs all control signals described above and receives all signals emitted by the elements described above.

The memory MEM1 operates conventionally during read, write and erase operations. Operations are provided to a sequencer in the form of operation codes CODE[OP]. The MODE signal is equal to 1 and multiplexers MUX1, MUX2 connect the address bus ABD to the inputs in [10:8] and in[18:11] of the RAC counter. The high order address bits are thus applied to the input of the RAC counter, and the low order address bits are applied to the input of the CAC counter. According to the invention, a page at address a[18:8] is erased by applying the voltage $V_{ER-}$ to the gates of the page transistors, whereas the inhibit voltage $V_{INHIB}$ ($V_{PCX}$) will be applied to the transistors for the other pages in the target sector. At the same time, the voltage $V_B$ is applied to the well of the sector in which the page to be erased is located, to generate the voltage $V_{ER+}$ on the source electrodes.

When a page has been erased, the sequencer SEQ triggers a process to read the CMPT counter intended to determine the address of a page to be controlled. For this purpose, the sequencer activates the decoder CDEC using the signal SELC, resets the CAC counter and activates the read circuit SA (READ signal). The first byte in the CMPT counter is output by circuit SA onto data bus DTB. If the signal STZ at the output from the detection circuit DETZ is equal to 1, then the first byte read in the CMPT counter only includes zeros. In other words, this means that the floating gate transistors in which the first byte in the CMPT counter was recorded have all been programmed. Therefore, the sequencer increments the CAC counter by one unit and reads the next byte, and so on if necessary until the signal DTZ drops to 0. When the signal DTZ drops to 0, the sequencer knows that a byte containing a bit equal to 1 corresponding to an erased transistor has been found. This is the first non-zero byte in the CMPT counter.

Bits c[7:0] in the non-zero byte are loaded into the register SREG and are located at the input to the conversion circuit CONVC. This circuit outputs the low order bits a'[10:8] of the address of the page to be checked, onto the inputs in[10:8] of the RAC counter, through multiplexer MUX1. The bits c[7:0] of the non-zero byte are converted into address bits a'[10:8] by the circuit CONVC in accordance with Table 2 below.

At the same time, the address bits of column a[7:0] of the non-zero byte of the CMPT counter, applied by the CAC counter to decoder YDEC, are present on the inputs in[10:8] of the RAC counter as high order address bits a'[18:11] of the address of the page to be controlled. The address of the page to be controlled, including bits a'[10:8] and bits a'[18:11] is thus loaded into the RAC counter using the LOAD1 command and the page checking process can begin.

TABLE 2

| C [7:0] | | | | | | | | A' [10:8] |
|---|---|---|---|---|---|---|---|---|
| 1 | 1 | 1 | 1 | 1 | 1 | 1 | 1 | 000 |
| 0 | 1 | 1 | 1 | 1 | 1 | 1 | 1 | 001 |
| 0 | 0 | 1 | 1 | 1 | 1 | 1 | 1 | 010 |
| 0 | 0 | 0 | 1 | 1 | 1 | 1 | 1 | 011 |
| 0 | 0 | 0 | 0 | 1 | 1 | 1 | 1 | 100 |
| 0 | 0 | 0 | 0 | 0 | 1 | 1 | 1 | 101 |
| 0 | 0 | 0 | 0 | 0 | 0 | 1 | 1 | 110 |
| 0 | 0 | 0 | 0 | 0 | 0 | 0 | 1 | 111 |

Figure 9:
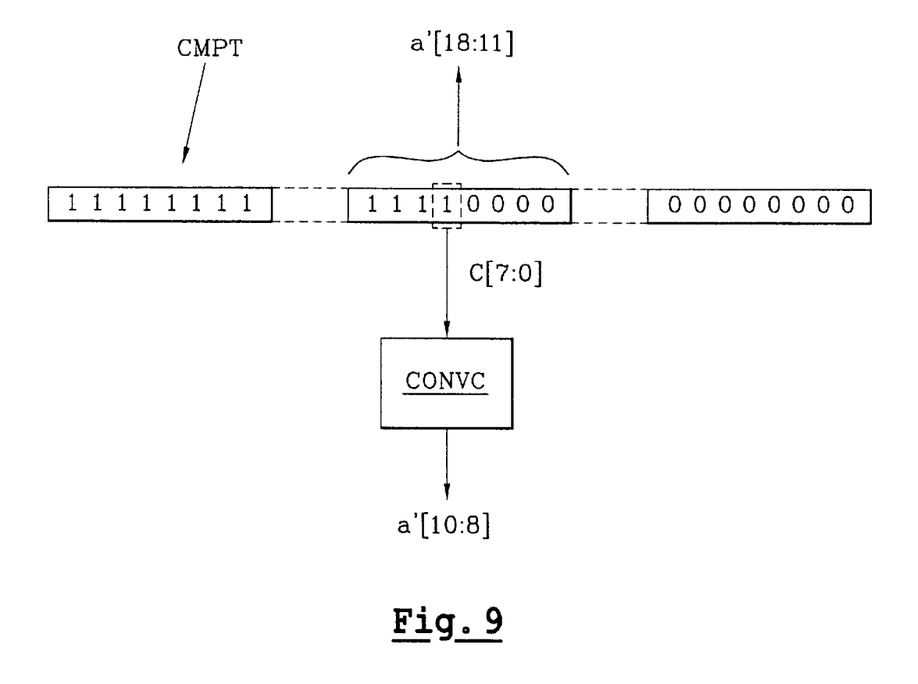
FIG. 9 shows a process for reading a counter according to the invention.

The read process for the CMPT counter that has just been described is shown in FIG. 9. The high order bits a'[18:11] of the address of the page correspond to the rank in the CMPT counter of the first non-zero byte found. Therefore, it is the address a[7:0] of the column containing a non-zero byte. Furthermore, the low order bits a'[10:8] of the address of the page to be checked correspond to the rank of the first non-zero bit in the first non-zero byte. Consequently, the complete address a'[18:8] determined by this process corresponds to the rank of the first non-zero bit in the CMPT counter, in other words, the rank of the first unprogrammed transistor.

During the checking step, the bytes of the selected page are read one after the other by incrementing the CAC counter. Each byte is read using two different read voltages. The first is the conventional read voltage $V_{READ}$ and the second is a verification voltage $V_{VRFY}$ greater than $V_{READ}$. The two voltages are obtained by varying the voltage $V_{PCX}$ applied to the decoder XDEC1.

Figure 7:
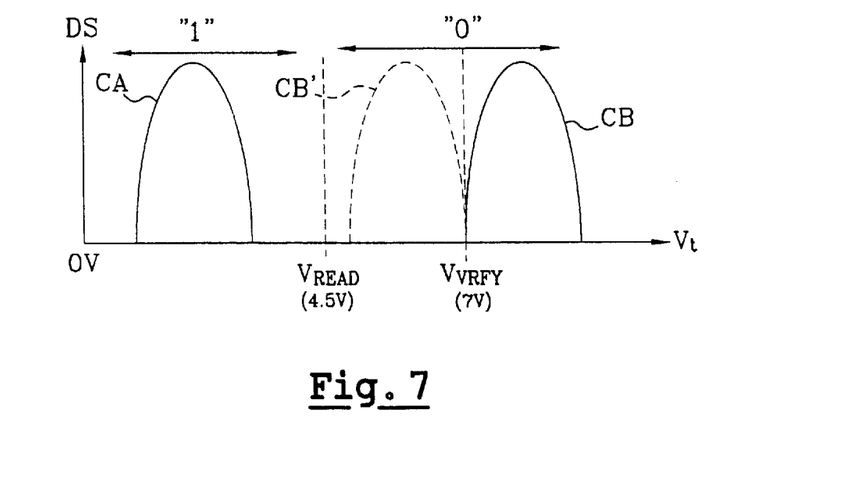
FIG. 7 shows statistical distribution curves for threshold voltages of floating gate transistors according to the invention.

FIG. 7 shows this double read check process, and shows the statistical distribution DS of threshold voltages Vt of the erased transistors (curve CA, read as a 1) and the statistical distribution of threshold voltages Vt of programmed transistors (curve CB, read as a 0). Under the effect of the electrical stress, the curve CB tends to shift slowly towards the left to form a curve CB'. The transistors related to the curve CB' have lost electrical charges and have lower threshold voltages than the normal. The voltage $V_{READ}$, on the order of 4.5 V, is at the left of curves CB and CB' and it cannot be used to distinguish between a transistor related to curve CB and a transistor related to curve CB'.

The verification voltage $V_{VRFY}$, for example 7 V, is between the two curves CB, CB' and it can be used to distinguish a transistor that is correctly programmed from a transistor for which the floating gate has lost electrical charges. This is so since in the first case the transistor will remain blocked, and in the second case the transistor will be conducting. Thus, comparison of a byte read using two voltages $V_{READ}$, $V_{VRFY}$ will thus be a means of detecting the existence of at least one programmed transistor for which the threshold voltage has become less than the voltage $V_{VRFY}$.

The comparison is made on the eight bits of each byte simultaneously using the comparator COMP. Byte W1 read at voltage $V_{VRFY}$ is stored in buffer BUF1, and byte W2 read at voltage $V_{READ}$ is located on the bus DTB and on the second input to the comparator. If the signal DOK at the output from the comparator changes to 0, the sequencer knows that all or some of the programmed transistors (if there are any) in which the byte is recorded have lost electrical charges. In this case, byte W2 which is the reference byte since it was read at voltage $V_{READ}$, is loaded in the programming register LT and the sequencer triggers a programming cycle to refresh the damaged cells. During the programming cycle, the reprogrammed transistors are the transistors for which a bit has been read and found equal to 0 at voltage $V_{READ}$, and the same bit has been read and found equal to 1 at voltage $V_{VRFY}$. Erased transistors are not concerned by this operation.

When all bytes on the page have been checked and the damaged memory cells have been reprogrammed, the sequencer increments the CMPT counter by one unit. As mentioned above, this incrementing includes programming the first unprogrammed transistor found in the step searching for the address of the page to be checked. Consequently, the sequencer applies high order address bits a[18:11] at the output from the RAC counter to the input of the CAC counter, as address bits of column a[7:0] of the non-zero byte of the CMPT counter.

This operation is the inverse of the operation performed earlier to find the address of the page to be checked, and uses a connection between the output from the RAC counter and the input to the CAC counter that is not shown in FIG. 8 for reasons of clarity. Once the address of the non-zero byte has been recovered by the CAC counter, the value of the non-zero byte kept by the register SREG is incremented by a right shift (SHIFT signal). The incremented value is then put in register LT to program the byte. A single bit equal to 0 has been added by the right shift, and reprogramming the non-zero byte will result in reprogramming the first floating gate transistor erased found during the search for the address of the page to be checked. The transistors that have already been programmed are not reprogrammed.

If the register SREG outputs the overflow signal OVFC after inserting a bit equal to a 0 by a right shift, then the byte only contains zeros. Thus, after programming the byte to zero in the CMPT counter, the sequencer increments the CAC counter for checking purposes. If the CAC counter outputs the overflow signal OVF2, then the byte equal to a 0 was the last byte in the CMPT counter. In this case, the sequencer knows that it must reset the CMPT counter to zero after the next page checking cycle. The page remaining to be checked is the last page in memory.

The transistor checking and reprogramming process that has just been described is particularly easy to use and does not require much hardware. It is also practically transparent to the user since the checking time for a page, including the reprogramming time if necessary, is on the order of 200 µs, compared with the order of 1,275 µs (255×5 µS) to program 255 bytes in a page, plus the time necessary for prior erasing of the page.

Obviously, many embodiments are possible for this invention. First, a CMPT counter according to the invention may comprise several word lines, depending on the size of the memory array to be checked. For example, a memory with 16 sectors and a capacity of 8 Mbits will require a counter with two rows of 2048 bits each, unless the counter is broken down into several counters each dedicated to one of the sectors.

Also, although the description discloses a method of counting rows to be refreshed in which a "token" corresponds to only one transistor, it would also be possible to program a group of transistors, for example four transistors, representing a token each time the counter is incremented, to allow for the failure of a transistor. In this case, the method of finding the address of the row to be refreshed includes finding the first group of four bits with at least three bits equal to 1 in the counter.

Furthermore, the process according to the invention may be applied to memory cells including PMOS type floating gate transistors. The voltage $V_{ER-}$ in this case is applied to the drains and not to the sources of the transistors.

Two aspects of the invention have been described above that are complementary to each other, but are nevertheless relatively distinct from each other. Thus, the checking process described above may be applied to any FLASH memory that is programmable by page, regardless of whether or not the selective erase process according to the invention is used. Conversely, the selective erase process according to the invention may be used in a memory using a checking process different from that what has been described above, and possibly a memory that does not have any means of checking and refreshing its cells.

That which is claimed is:

1. A process for recording data in a FLASH memory comprising a plurality of floating gate transistors forming a memory array, each transistor including a gate connected to a word line, and a row of transistors connected to a same word line defining a page, the process comprising:

erasing and programming the memory array by page; and checking a threshold voltage of the transistors in at least one page and reprogramming programmed transistors having a threshold voltage less than a desired threshold voltage, an address of the at least one page to be checked being read from a non-volatile counter formed by at least one row of the transistors in the memory array.

2. A process according to claim 1, wherein the counter is incremented by one after checking the at least one page by programming at least one transistor in the counter without erasing the other transistors therein, and wherein based upon a read direction of the counter, a transistor programmed in each new increment of the counter is the transistor following a transistor programmed in a previous increment.

3. A process according to claim 2, wherein the counter includes a plurality of words with increasing rank and the address of the at least one page to be checked is read in the counter by:

reading the counter word by word until finding a word containing a bit corresponding to an erased transistor;

determining a high order of bits of the address of the at least one page to be checked by using the rank in the counter of a first word containing a bit corresponding to the erased transistor; and     determining a low order of bits of the address of the at least one page to be checked using the rank, in the first word found, of a first bit corresponding to the erased transistor.

4. A process according to claim 1, wherein a set of pages define a sector, and wherein the transistors in the counter are in a sector dedicated to the counter such that programming voltages applied to transistors in another sector do not affect the transistors in the counter.

5. A process according to claim 1, wherein each page to be checked is checked word by word and comprises:

applying a first read voltage to gates of the transistors corresponding to the word considered for a first read of the word;

applying a second read voltage to the gates of the transistors corresponding to the word considered for a second read of the word;

comparing a result of the two reads; and reprogramming the transistors corresponding to the word considered if the two reads produce different values, with a reference value being equal to a value of the word read when the first read voltage was applied.

6. A process according to claim 1, wherein a plurality of pages are checked each time after a page has been programmed.

7. A process according to claim 1, wherein only one page is checked after a plurality of pages have been programmed.

8. A process according to claim 1, wherein erasing a page comprises:

applying a positive erase voltage to a source or drain of all transistors in a sector in the memory array containing the page to be erased;

applying a negative erase voltage to gates of the transistors of the page to be erased; and     applying a positive inhibit voltage to gates of transistors of at least one page that is not to be erased.

9. A process according to claim 8, further comprising providing a plurality of voltage adaptor circuits for receiving a page selection signal, and the voltage adapter circuits outputting to gates of the transistors for a corresponding page a positive voltage when the page selection signal is equal to a first value corresponding to non-selection of the at least one page and when the memory is in an erase mode or when the page selection signal is equal to a second value corresponding to selection of the at least one page and the memory is not in the erase mode, or a biasing voltage less than the positive voltage when the page selection signal is equal to the second value and the memory is in erase mode or when the page selection signal is equal to the first value and the memory is not in the erase mode.

10. A process according to claim 9, further comprising:

supplying to the plurality of voltage adaptor circuits a biasing voltage equal to the negative erase voltage and a positive voltage equal to the inhibit voltage while erasing a page; and     supplying to the plurality of voltage adaptor circuits a biasing voltage equal to a ground potential and a positive voltage equal to a read voltage while reading a word in the memory.

11. A process for recording data in a FLASH memory comprising a plurality of transistors forming a memory array, each transistor including a control terminal connected to a word line, and a row of transistors connected to a same word line defining a page, the process comprising:

erasing and programming the memory array by page; and checking a threshold voltage of the transistors in at least one page and reprogramming programmed transistors having a threshold voltage less than a desired threshold voltage, an address of the at least one page to be checked being read from a non-volatile counter formed by at least one row of the transistors in the memory array.

12. A process according to claim 11, wherein the counter is incremented by one after checking the at least one page by programming at least one transistor in the counter without erasing the other transistors therein, and wherein based upon a read direction of the counter, a transistor programmed in each new increment of the counter is the transistor following a transistor programmed in a previous increment.

13. A process according to claim 11, wherein the counter includes a plurality of words with increasing rank and the address of the at least one page to be checked is read from the counter by:

reading the counter word by word until finding a word containing a bit corresponding to an erased transistor;

determining a high order of bits of the address of the at least one page to be checked by using the rank in the counter of a first word containing a bit corresponding to the erased transistor; and     determining a low order of bits of the address of the at least one page to be checked using the rank, in the first word found, of a first bit corresponding to the erased transistor.

14. A process according to claim 11, wherein a set of pages define a sector, and wherein the transistors in the counter are in a sector dedicated to the counter such that programming voltages applied to transistors in another sector do not affect the transistors in the counter.

15. A process according to claim 11, wherein each page to be checked is checked word by word and comprises:

applying a first read voltage to control terminals of the transistors corresponding to the word considered for a first read of the word;

applying a second read voltage to the control terminals of the transistors corresponding to the word considered for a second read of the word;

comparing a result of the two reads; and reprogramming the transistors corresponding to the word considered if the two reads produce different values, with a reference value being equal to a value of the word read when the first read voltage was applied.

16. A process according to claim 11, wherein a plurality of pages are checked each time after a page has been programmed.

17. A process according to claim 11, wherein only one page is checked after a plurality of pages have been programmed.

18. A process according to claim 11, wherein a set of pages form a sector, and wherein erasing a page comprises:

applying a positive erase voltage to a first or second conduction terminal of all transistors in a sector in the memory array containing the page to be erased;

applying a negative erase voltage to control terminals of the transistors of the page to be erased; and applying a positive inhibit voltage to control terminals of transistors of at least one page that is not to be erased.

19. A process according to claim 18, further comprising providing a plurality of voltage adaptor circuits for receiving a page selection signal, and the voltage adapter circuits outputting to control terminals of the transistors for a corresponding page a positive voltage when the page selection signal is equal to a first value corresponding to non-selection of the at least one page and when the memory is in an erase mode or when the page selection signal is equal to a second value corresponding to selection of the at least one page and the memory is not in the erase mode; or a biasing voltage less than the positive voltage when the page selection signal is equal to the second value and the memory is in erase mode or when the page selection signal is equal to the first value and the memory is not in the erase mode.

20. A process according to claim 19, further comprising:

supplying to the plurality of voltage adaptor circuits a biasing voltage equal to the negative erase voltage and a positive voltage equal to the inhibit voltage while erasing a page; and supplying to the plurality of voltage adaptor circuits a biasing voltage equal to a ground potential and a positive voltage equal to a read voltage while reading a word in the memory.

* * * * *

UNITED STATES PATENT AND TRADEMARK OFFICE
CERTIFICATE OF CORRECTION

PATENT NO. : 6,568,510 B2
DATED : May 27, 2003
INVENTOR(S) : Cavaleri et al.

It is certified that error appears in the above-identified patent and that said Letters Patent is hereby corrected as shown below:

Column 2,
Line 31, delete "ate" insert -- are --

Column 6,
Line 49, delete "EG" insert -- FG --
Line 56, delete "shell" insert -- well --

Column 7,
Line 29, delete "F" insert -- P --

Column 8,
Line 45, delete "WAND" insert -- NAND --
Line 47, delete "24" insert -- P4 --

Column 10,
Line 36, delete "and T13"

Column 11,
Line 63, delete "X2Z" insert -- X2*Z --

Column 12,
Line 28, delete "1"

Signed and Sealed this

Eighteenth Day of November, 2003

JAMES E. ROGAN
*Director of the United States Patent and Trademark Office*